United States Patent
Yen et al.

(10) Patent No.: US 9,184,721 B2
(45) Date of Patent: Nov. 10, 2015

(54) SIGNAL-TRANSMISSION-LINE STRUCTURE AND ELECTRONIC DEVICE USING THE SAME

(71) Applicant: REALTEK SEMICONDUCTOR CORP., Hsinchu (TW)

(72) Inventors: Hsiao-Tsung Yen, Hsinchu (TW); Yuh-Sheng Jean, Hsinchu (TW); Ta-Hsun Yeh, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/450,703

(22) Filed: Aug. 4, 2014

(65) Prior Publication Data
US 2015/0280684 A1    Oct. 1, 2015

(30) Foreign Application Priority Data

Mar. 28, 2014    (TW) .............. 103111871 A

(51) Int. Cl.
*H01L 29/40*    (2006.01)
*H03H 7/38*    (2006.01)
*H01P 3/02*    (2006.01)

(52) U.S. Cl.
CPC . *H03H 7/38* (2013.01); *H01P 3/026* (2013.01)

(58) Field of Classification Search
CPC ................... H03H 7/38; H01P 3/026
See application file for complete search history.

(56) References Cited

U.S. PATENT DOCUMENTS

| 8,502,338 B2 | 8/2013 | Yen et al. |
| 2010/0140758 A1 | 6/2010 | Doherty et al. |
| 2013/0234305 A1 | 9/2013 | Lin et al. |

*Primary Examiner* — Long Pham
(74) *Attorney, Agent, or Firm* — Rabin & Berdo, P.C.

(57) ABSTRACT

A signal-transmission-line structure includes a substrate, a through-silicon via (TSV) trench, a conductive substance, at least a conductor wire, and a dielectric layer. The substrate has a first surface and a second surface opposite to each other. The TSV trench is formed in the first surface of the substrate and extends along the first surface. The bottom surface of the TSV trench is located between the first surface and the second surface of the substrate. The TSV trench is filled with the conductive substance to form a transmission line. The conductor wire is located above the transmission line. The dielectric layer is located on the first surface of the substrate, and separates the conductor wire from the transmission line.

10 Claims, 18 Drawing Sheets

SIGNAL-TRANSMISSION-LINE STRUCTURE AND ELECTRONIC DEVICE USING THE SAME

CROSS-REFERENCES TO RELATED APPLICATIONS

This non-provisional application claims priority under 35 U.S.C. §119(a) on Patent Application No. 103111871 filed in Taiwan, R.O.C. on 2014 Mar. 28, the entire contents of which are hereby incorporated by reference.

BACKGROUND

1. Technical Field

The present invention relates to a structure design of a microstrip line, and more particularly to a signal-transmission-line structure and an electronic device using the same.

2. Related Art

Currently, along with the rapid development and broad requirements of wireless communications technologies such as a wireless network, a mobile phone, a Global Positioning System (GPS), and a digital television, designing and manufacturing of a high-speed digital circuit have become an extremely hot electronic technology in the field of communications. Generally, most high-speed digital circuits apply microstrips or striplines for signal transmission, so as to transmit high-speed digital signals. Nowadays, various circuit board structures used for transmitting high-speed digital signals have been developed in the field of electronics.

In a conventional signal-transmission-line structure, two corresponding metal layers are formed respectively in two surfaces of a dielectric layer. In order to provide preferable signal transmission, the two metal layers have to be separated by at least a specific distance (that is, the dielectric layer has a specific thickness), for example, 2 µm. However, in a 65 nm CMOS process, for example, two metal layers are at most separated by 3 µm (which is a possible distance between a lowest metal layer and a highest metal layer); and in a 28 nm CMOS process, two metal layers are at most separated by 1.5 µm. The electronic device tends to be lighter, thinner, shorter, and smaller; however, to maintain the signal quality, the size of the signal-transmission-line structure is difficult to be further reduced, and therefore, the overall volume of the electronic device is limited. On the other hand, in an advanced process, metal layers and oxide layers are increasingly thinner. That induces higher resistance and higher capacitance, which makes lower Characteristics impedance (Z0) to make the design of the transmission line much more difficult.

SUMMARY

In an embodiment, a signal-transmission-line structure includes a substrate, a TSV trench, a conductive substance, at least a first conductor wire, and a dielectric layer. The substrate has a first surface and a second surface opposite to each other. The TSV trench is formed in the first surface of the substrate and extends along the first surface. The bottom surface of the TSV trench is located between the first surface and the second surface of the substrate. The TSV trench is filled with the conductive substance to form a transmission line. The first conductor wire is located above the transmission line. The dielectric layer is located on the first surface of the substrate, and separates the first conductor wire from the transmission line.

In another embodiment, an electronic device using a signal-transmission-line structure includes the signal-transmission-line structure as described above, a front-stage circuit, and a post-stage circuit. The front-stage circuit is coupled to one end of each transmission line and one end of each first conductor wire, and the post-stage circuit is coupled to the other end of each transmission line and the other end of each first conductor wire. The front-stage circuit and the post-stage circuit have different characteristic impedances or different phases, and the signal-transmission-line structure is used for adjusting the characteristic impedance or the phase.

Accordingly, in the signal-transmission-line structure and the electronic device using the same according to the present invention, the TSV technology is used to form the transmission lines in the substrate, so as to provide a large distance required between a signal path and a ground path, thereby reducing a planar area used by the signal-transmission-line structure, and providing a preferable element feature. The signal-transmission-line structure and the electronic device using the same according to the present invention can provide low resistance, small parasitic capacitance, and large inductance, and can easily provide required characteristic impedance (such as 50 ohm or 75 ohm). Further, the signal-transmission-line structure and the electronic device using the same according to the present invention can further provide slow wave effects, so as to reduce required signal transmission length, thereby further reducing the area of a chip.

DETAILED DESCRIPTION

Figure 1:
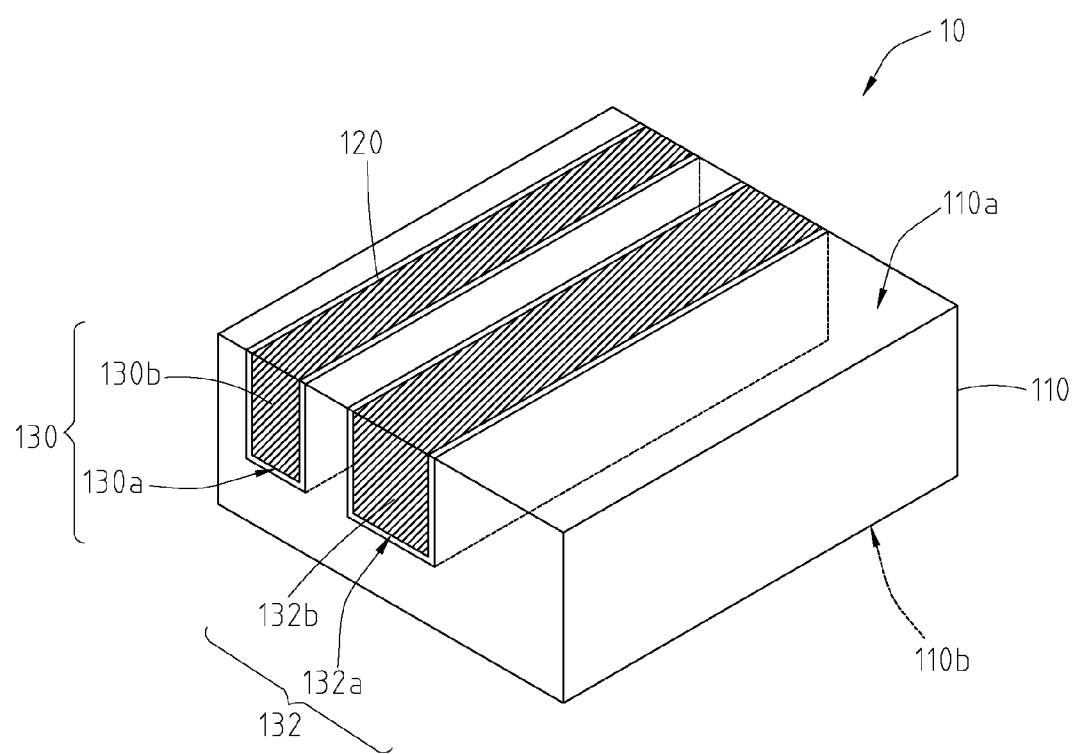
FIG. 1 is a schematic view of a signal-transmission-line structure according to a first embodiment of the present invention.
Figure 2:
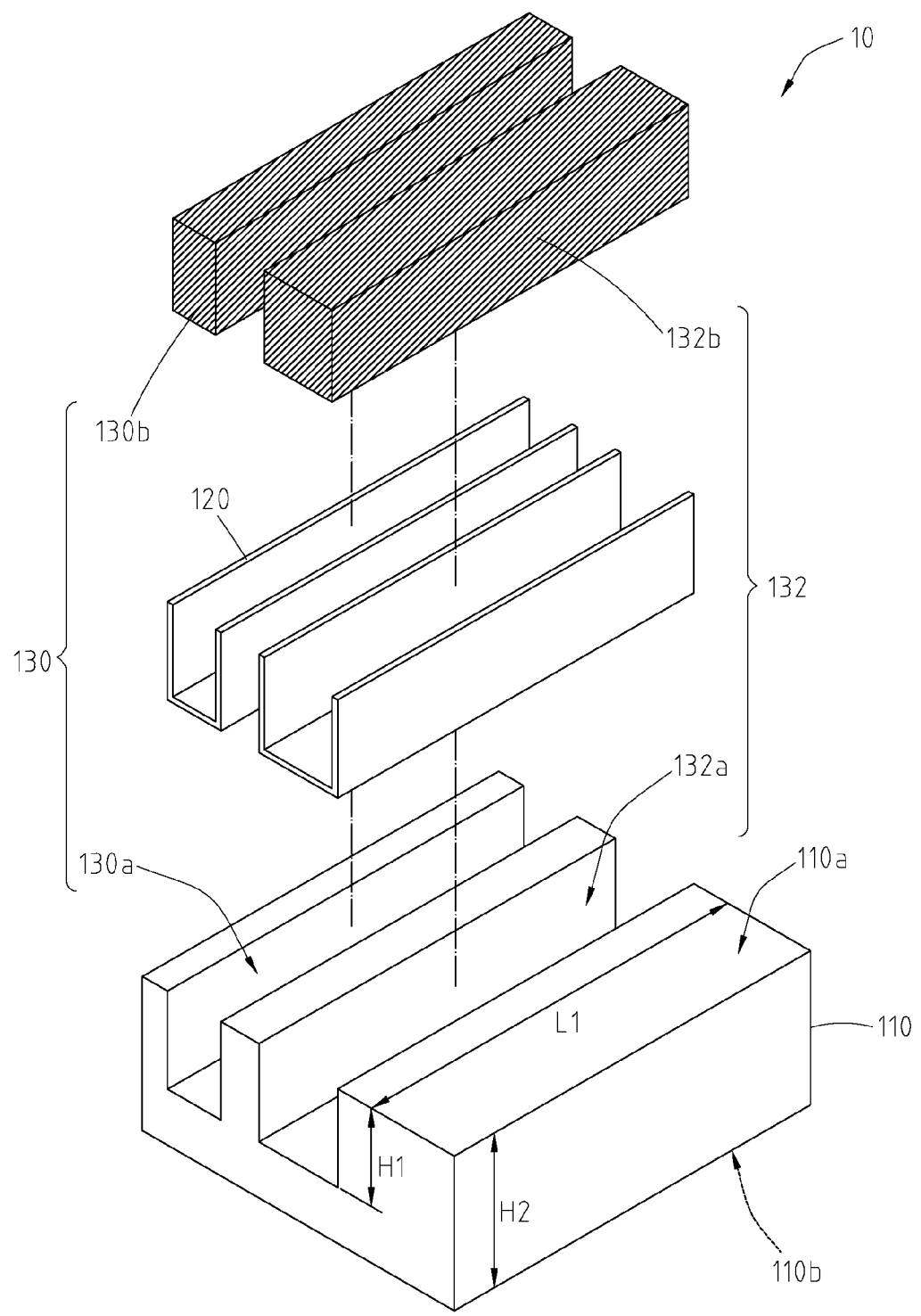
FIG. 2 is an exploded view of a signal-transmission-line structure in FIG. 1.

Referring to FIG. 1 and FIG. 2, a signal-transmission-line structure 10 includes: a substrate 110, a plurality of through-silicon via (TSV) trenches 130a and 132a, and conductive substances 130b and 132b. Two TSV trenches are used as an example in the following.

The substrate 110 has a first surface 110a and a second surface 110b, and the first surface 110a and the second surface 110b are opposite to each other. In other words, the first surface 110a of the substrate 110 is an upper surface, and the second surface 110b of the substrate 110 is a lower surface.

The TSV trenches 130a and 132a are formed in the first surface 110a of the substrate 110. Each of the TSV trenches 130a and 132a extends along the first surface 110a by the length L1. In other words, the TSV trenches 130a and 132a are of a strip shape.

Each of the TSV trenches 130a and 132a extends from the first surface 110a downwards (towards the second surface 110b) by the depth H1, but does not penetrate the substrate 110. Here, the depth H1 of each of the TSV trenches 130a and 132a is less than the thickness H2 of the substrate 110, that is, the bottom surface of each of the TSV trenches 130a and 132a is located between the first surface 110a and the second surface 110b.

In some embodiments, the depth H1 of each of the TSV trenches 130a and 132a is greater than or equal to one half of the thickness H2 of the substrate 110.

In some embodiments, the depth H1 of each of the TSV trench 130a and 132a is greater than or equal to about 5 μm. In some embodiments, the depth of the TSV may be 5 μm to 60 μm, and mainly ranges from 15 μm to 25 μm in an actual implementation state. In other words, the depth of the TSV trench is preferably between 5 μm and 60 μm, and is more preferably between 15 μm and 25 μm.

The conductive substances 130b and 132b are respectively corresponding to the TSV trenches 130a and 132a. The conductive substance 130b fills the corresponding TSV trench 130a, so as to form a transmission line 130. The conductive substance 132b fills the corresponding TSV trench 132a, so as to form a transmission line 132. In other words, the transmission lines 130 and 132 are embedded in the surface of the substrate 110 (that is, embedded in the substrate 110). Therefore, the formed transmission line has a structure characteristic of the TSV technology, that is, has a larger thickness (substantially equal to the depth H1) as compared with a common circuit layer. In some embodiments, the thickness of the transmission line is greater than or equal to about 5 μm, is preferably between 5 μm and 60 μm, and is more preferably between 15 μm and 25 μm.

In some embodiments, the substrate 110 may be a silicon substrate. At this time, an insulating layer 120 is formed between the substrate 110 and each transmission line 130/132. The insulating layer 120 separates the substrate 110 from each transmission line 130/132, so that the substrate 110 is electrically insulated from each transmission line 130/132. The material of the insulating layer 120 may be, for example, $SiO_2$ or SiN, and may also be an oxide layer of another material.

In some embodiments, one of the transmission lines 130 and 132 may be used as a signal path, and the other one may be used as a ground path. A distance between the two may be selectively adjusted as required by design.

Figure 3:
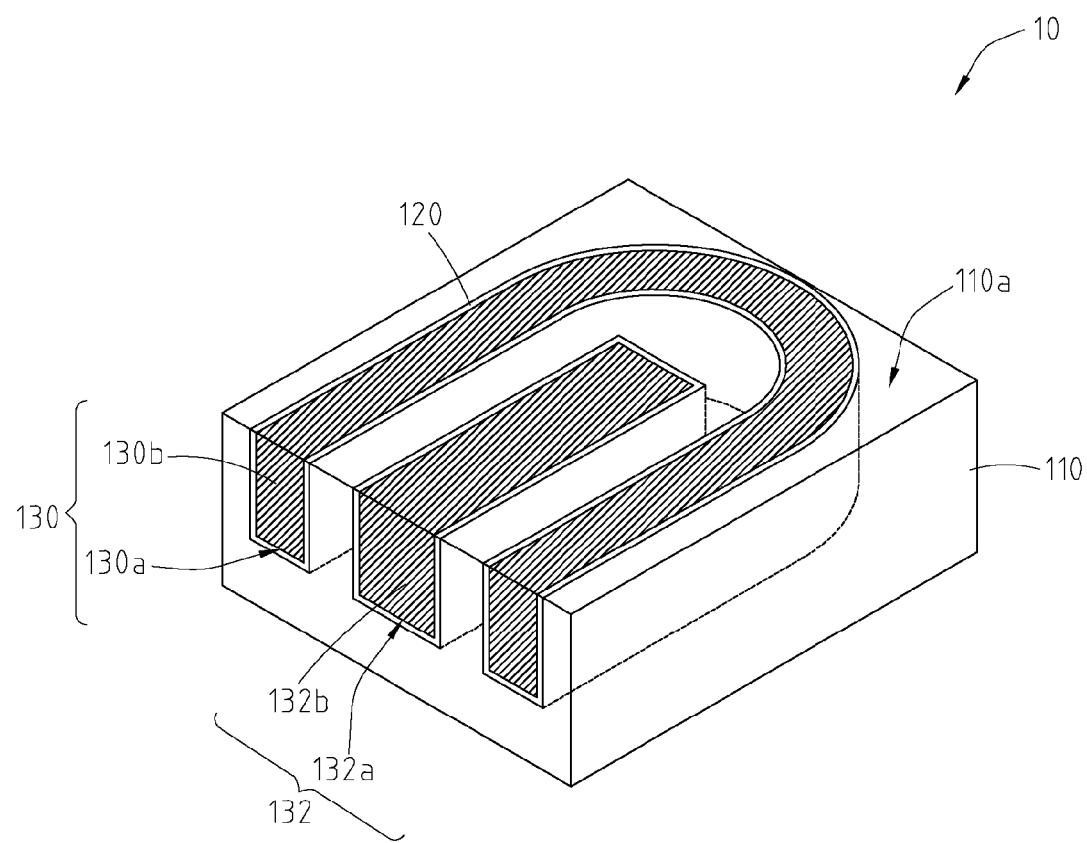
FIG. 3 is a schematic view of a signal-transmission-line structure according to a second embodiment of the present invention.

For ease of description, the two TSV trenches 130a and 132a are respectively referred to as a first TSV trench 130a and a second TSV trench 132a. In some embodiments, referring to FIG. 3, viewing from a top view of the first surface 110a of the substrate 110, the first TSV trench 130a extends along the first surface 110a in a folded manner by the length L, and the second TSV trench 132a is located between two ends of the first TSV trench 130a. In other words, two ends of the first TSV trench 130a and one end of the second TSV trench 132a are located at the same side of the substrate 110. The other end of the second TSV trench 132a is located at the other side of the substrate 110, and the first TSV trench 130a extends to bypass the other end of the second TSV trench 132a. The first TSV trench 130a may assume a U shape.

Here, the transmission line 130 may be used as a ground path, the transmission line 132 is used as a signal path, and the transmission line 130 is configured in a folded manner, so as to form folded coplanar waveguide (folded CPW) architecture, so that the signal path is sandwiched between the ground path, thereby providing desirable signal shielding and providing common-ground, and saving the used area.

Figure 4:
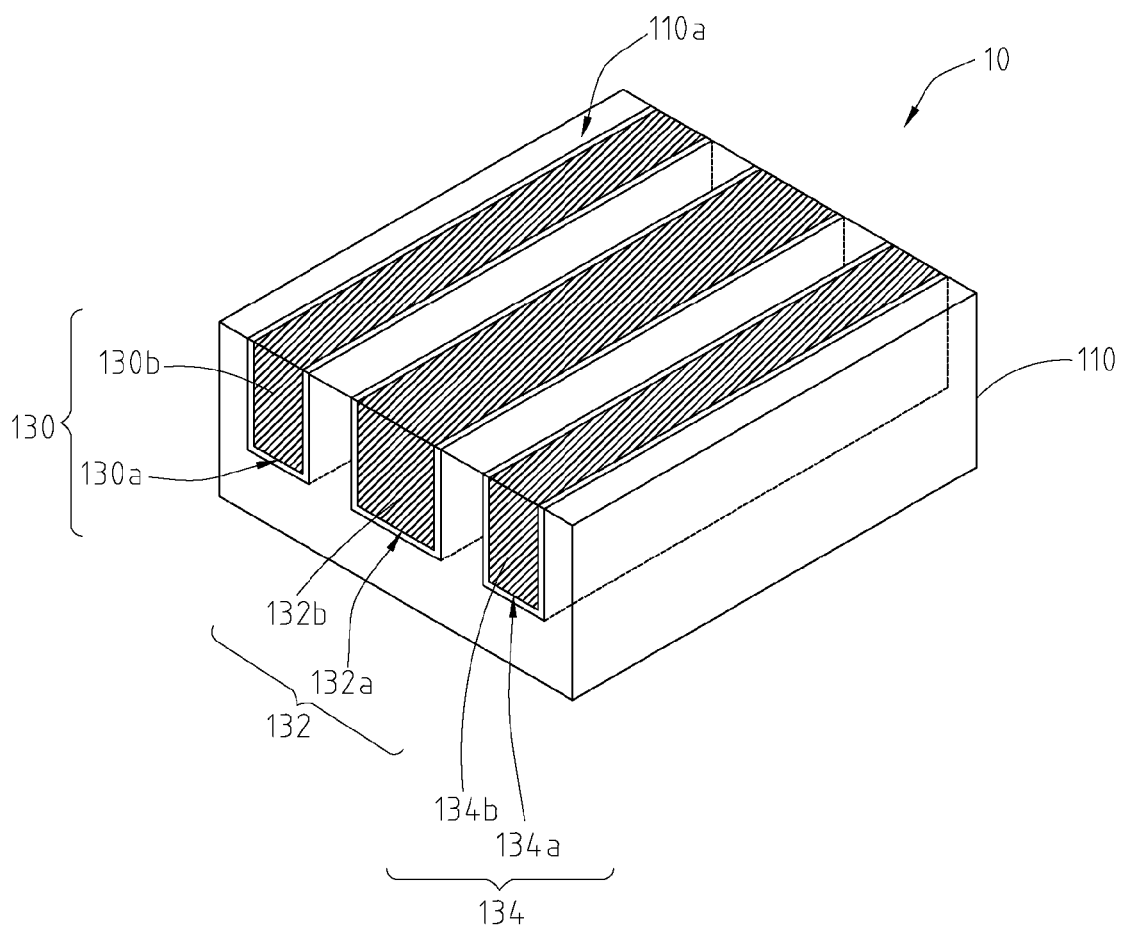
FIG. 4 is a schematic view of a signal-transmission-line structure according to a third embodiment of the present invention.

Referring to FIG. 4, in some embodiments, the signal-transmission-line structure 10 may have three or more transmission lines 130, 132 and 134 formed by filling conductive substances 130b, 132b and 134b into TSV trenches 130a, 132a and 134a. Here, the transmission lines 130 and 134 may be used as ground paths, and the transmission line 132 is used as the signal path, so that the signal path is sandwiched between the ground paths, thereby providing preferable signal shielding.

In some embodiments, when the signal-transmission-line structure 10 has more than four transmission lines (not shown), the transmission lines may be used as signal paths or ground paths alternatively, that is, the signal paths and ground paths are configured alternatively in sequence, so as to form coplanar waveguide (CPW) architecture.

In some embodiments, the transmission lines 130, 132 and 134 formed by filling the conductive substances 130b, 132b and 134b in the TSV trenches 130a, 132a and 134a may also be used as ground paths only.

Here, the conductive substances 130b, 132b and 134b forming different transmission lines 130 and 132 may be of the same material or different materials. The conductive substances 130b, 132b and 134b may be of metal materials.

Figure 5:
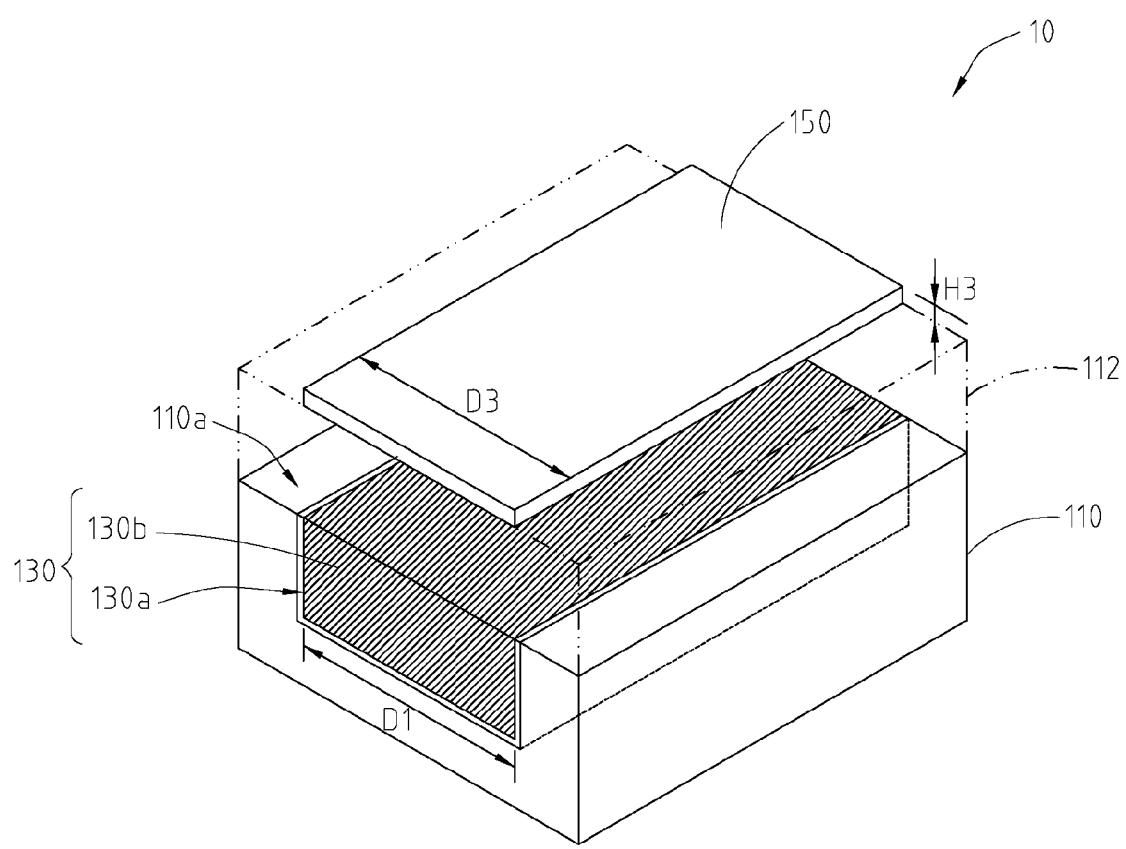
FIG. 5 is a schematic view of a signal-transmission-line structure according to a fourth embodiment of the present invention.
Figure 6:
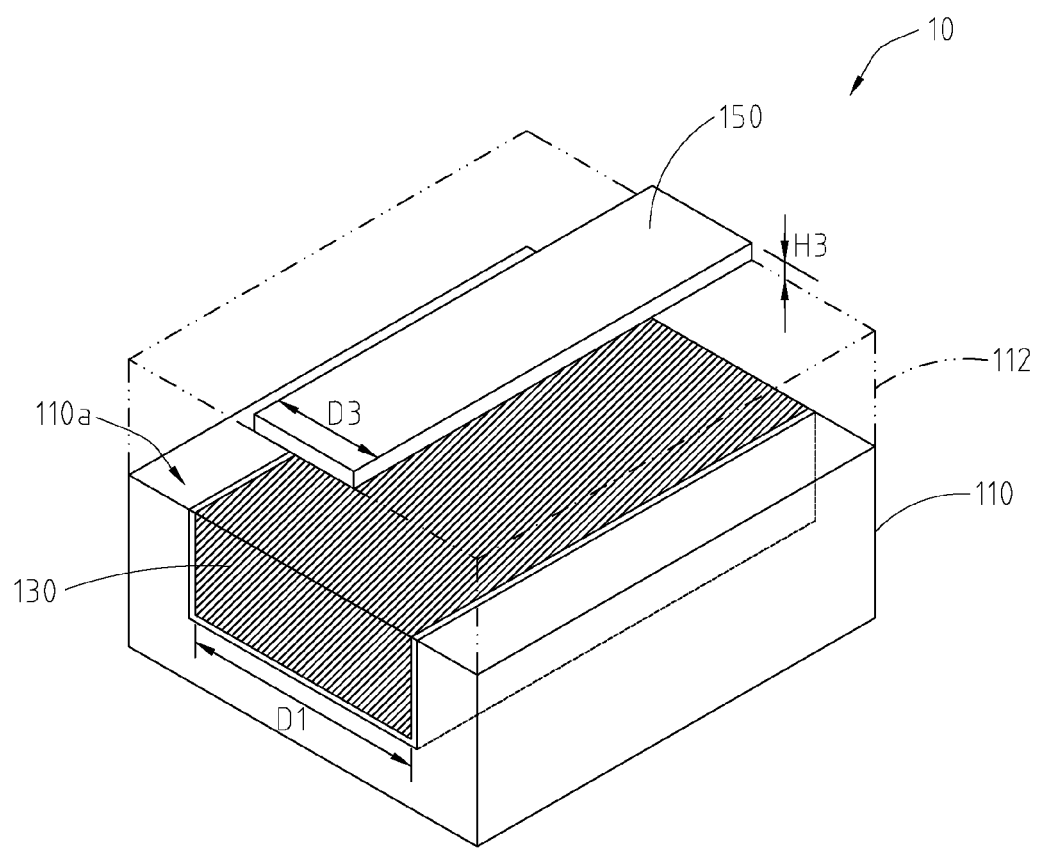
FIG. 6 is a schematic view of a signal-transmission-line structure according to a fifth embodiment of the present invention.

Referring to FIG. 5 and FIG. 6, the signal-transmission-line structure 10 may further include a dielectric layer 112 and at least a conductor wire (referred to as a first conductor wire 150). In the drawing, the dielectric layer 112 is transparent to clearly show other components. Here, the transmission line 130 is used as a ground path, and the first conductor wire 150 is used as a signal path; however, the present invention is not limited thereto, the transmission line 130 may also be used as a signal path, and the first conductor wire 150 is used as a ground path.

The first conductor wire 150 is located above the transmission line 130. The dielectric layer 112 is located on the first surface 110a of the substrate 110, and separates the first conductor wire 150 from the transmission line 130.

Here, the transmission line 130 is formed by filling the conductive substance in the TSV trench, as described above, and the conductor wire 150 may be formed by patterning a metal layer. In other words, the thickness H3 of the conductor wire 150 is the line thickness of a common single circuit layer.

In other words, the thickness of the transmission line 130 (that is, the depth H1 of the TSV trench) is greater than the thickness H3 of the conductor wire 150.

Figure 7:
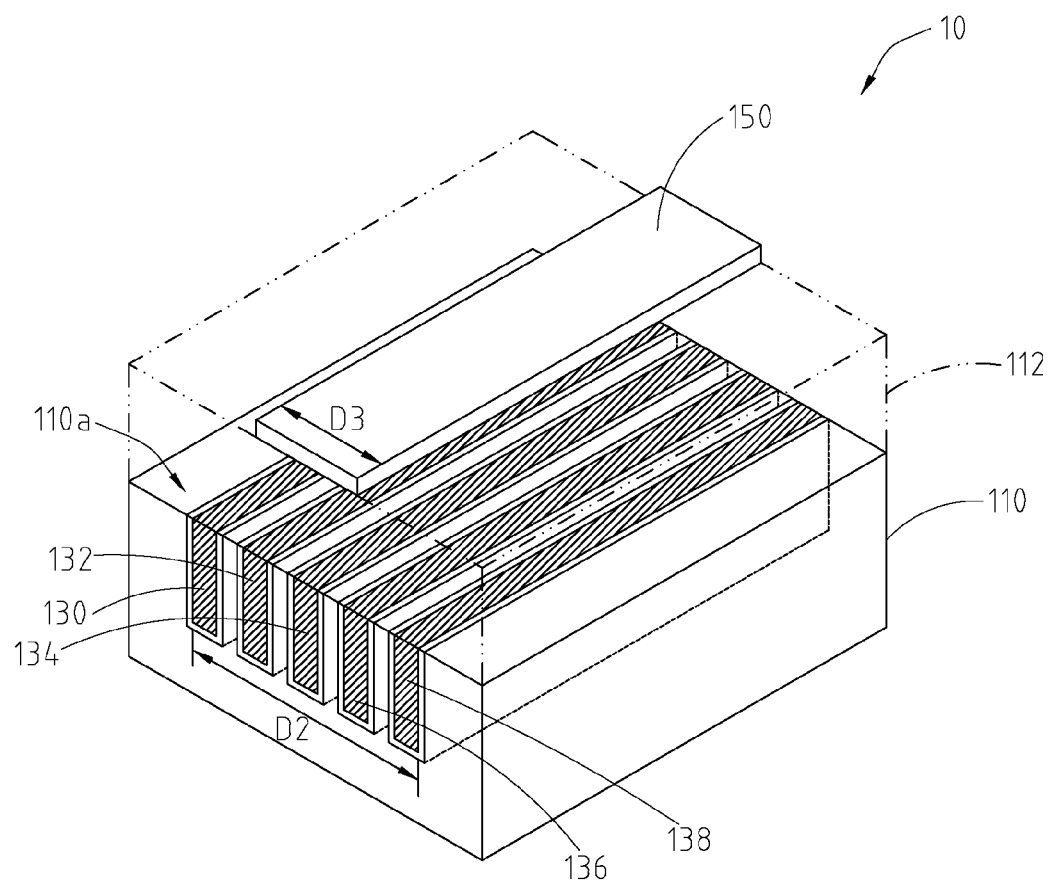
FIG. 7 is a schematic view of a signal-transmission-line structure according to a sixth embodiment of the present invention.
Figure 8:
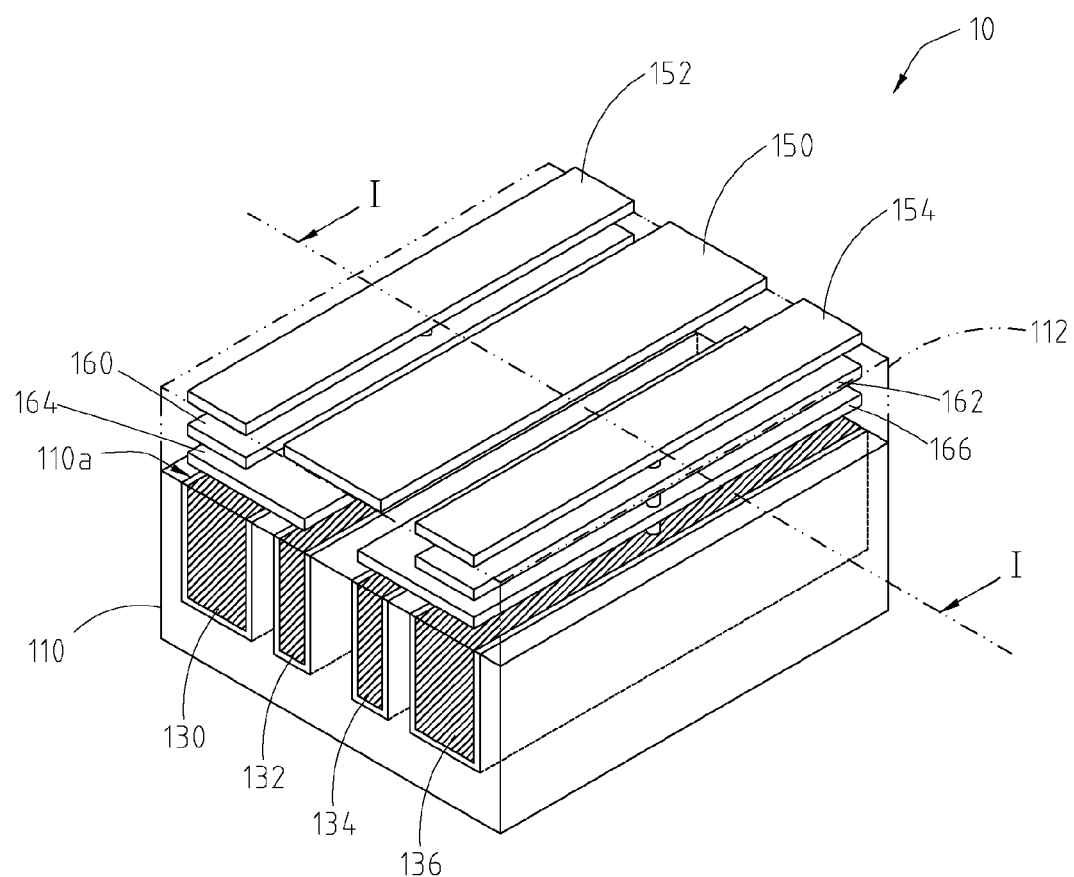
FIG. 8 is a schematic view of a signal-transmission-line structure according to a seventh embodiment of the present invention.

In some embodiments, the arranged width of the transmission line 130 (that is, the width D1 of the transmission line 130) may be equal to the arranged width of the first conductor wire 150 (that is, the width D3 of the first conductor wire 150), as shown in FIG. 5 and FIG. 8. Further, the arranged width (that is, the width D1) of the transmission line 130 may also be greater than the arranged width (that is, the width D3) of the first conductor wire 150, as shown in FIG. 6 and FIG. 7; however, the wire width of the transmission line 130 may be less than or greater than the wire width of the first conductor wire 150.

For example, referring to FIG. 6, the wire width (equal to the width D1) of the transmission line 130 is actually greater than the wire width (equal to the width D3) of the first conductor wire 150. Referring to FIG. 7, the wire width of the transmission line 130 is less than the wire width of the first conductor wire 150; however, the arranged width (that is, the width D1) of the transmission line 130 is greater than the arranged width (that is, the width D3) of the first conductor wire 150.

Figure 9:
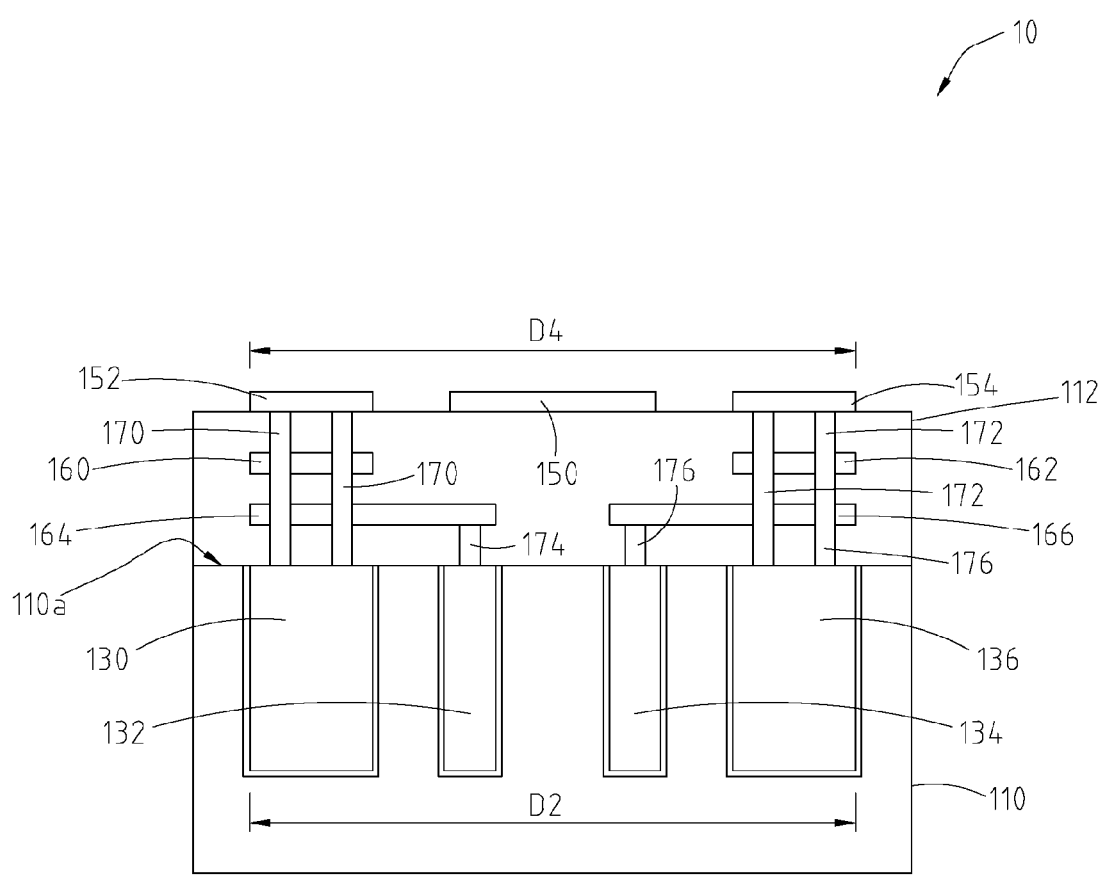
FIG. 9 is a sectional view of FIG. 8 along line I-I.

In some embodiments, referring to FIG. 7 to FIG. 9, the signal-transmission-line structure 10 may be provided with a plurality of transmission lines 130, 132, 134, 136 and 138. Here, each of the transmission lines 130, 132, 134, 136 and 138 is formed by filling the conductive substance in the TSV trench, as described above, and the transmission lines 130, 132, 134, 136 and 138 are all used as ground paths. The first conductor wire 150 is used as a signal path. On the contrary, the transmission lines 130, 132, 134, 136 and 138 may also be all used as signal paths, and the first conductor wire 150 is used as a ground path. Moreover, other configuration manners are substantially the same as the foregoing descriptions, and are not repeated herein.

In some embodiments, the first conductor wire 150 may be disposed corresponding to the middle of the transmission lines 130, 132, 134, 136 and 138.

In some embodiments, the arranged width D2 of the transmission lines 130, 132, 134, 136 and 138 may be equal to the arranged width (that is, the width D4) of the first conductor wire 150, as shown in FIG. 8 and FIG. 9. Further, the arranged width (that is, the width D2) of the transmission line 130 may also be greater than the arranged width (that is, the width D3) of the first conductor wire 150, as shown in FIG. 7.

In some embodiments, when the signal-transmission-line structure 10 is provided with a plurality of transmission lines 130, 132, 134, 136 and 138, the transmission lines 130, 132, 134, 136 and 138 may have the equal width (as shown in FIG. 7) or have different widths (as shown in FIG. 8 and FIG. 9).

In some embodiments, referring to FIG. 8 to FIG. 14, the signal-transmission-line structure 10 may be provided with a plurality of first conductor wires 150, 152 and 154. Here, the signal-transmission-line structure 10 may be provided with a single transmission line 130 or a plurality of transmission lines 130, 132, 134 and 136. Here, each of the transmission lines 130, 132, 134 and 136 is formed by filling the conductive substance in the TSV trench, as described above, and the transmission lines 130, 132, 134 and 136 are all used as ground paths.

The first conductor wires 150, 152 and 154 are located on the same plane, and the plane is substantially parallel to the first surface 110a of the substrate 110. In some embodiments, the first conductor wires 150, 152 and 154 may be formed by patterning the same metal layer.

The first conductor wires 150, 152 and 154 are located above the transmission lines 130, 132, 134 and 136. The dielectric layer 112 is formed on the first surface 110a of the substrate 110, and separates the first conductor wires 150, 152 and 154 from the transmission lines 130, 132, 134 and 136.

The first conductor wire 150 is used as a signal path, and the first conductor wires 152 and 154 are used as ground paths, so as to provide preferable signal shielding.

Figure 10:
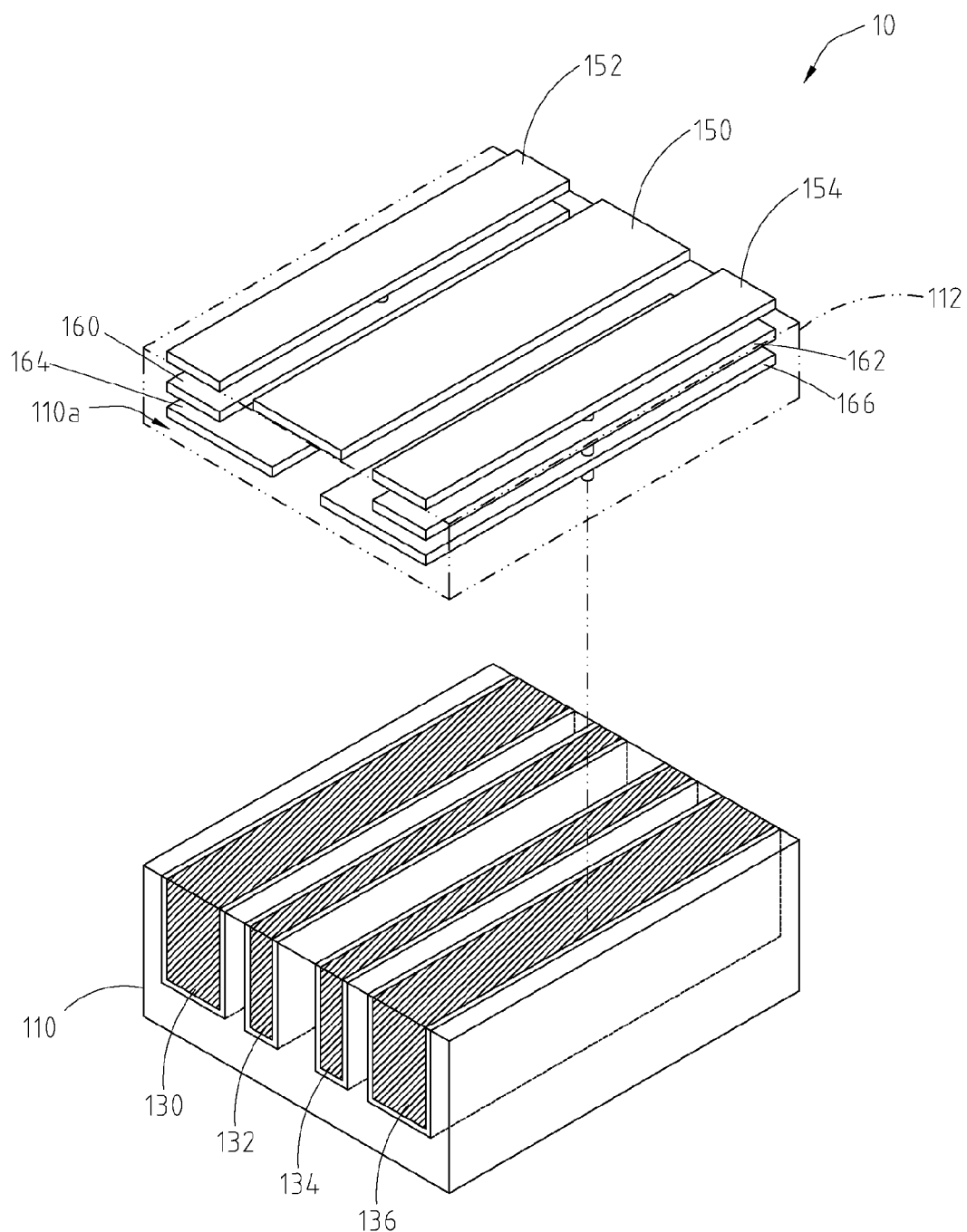
FIG. 10 is an exploded view of a signal-transmission-line structure 10 in FIG. 8.
Figure 11:
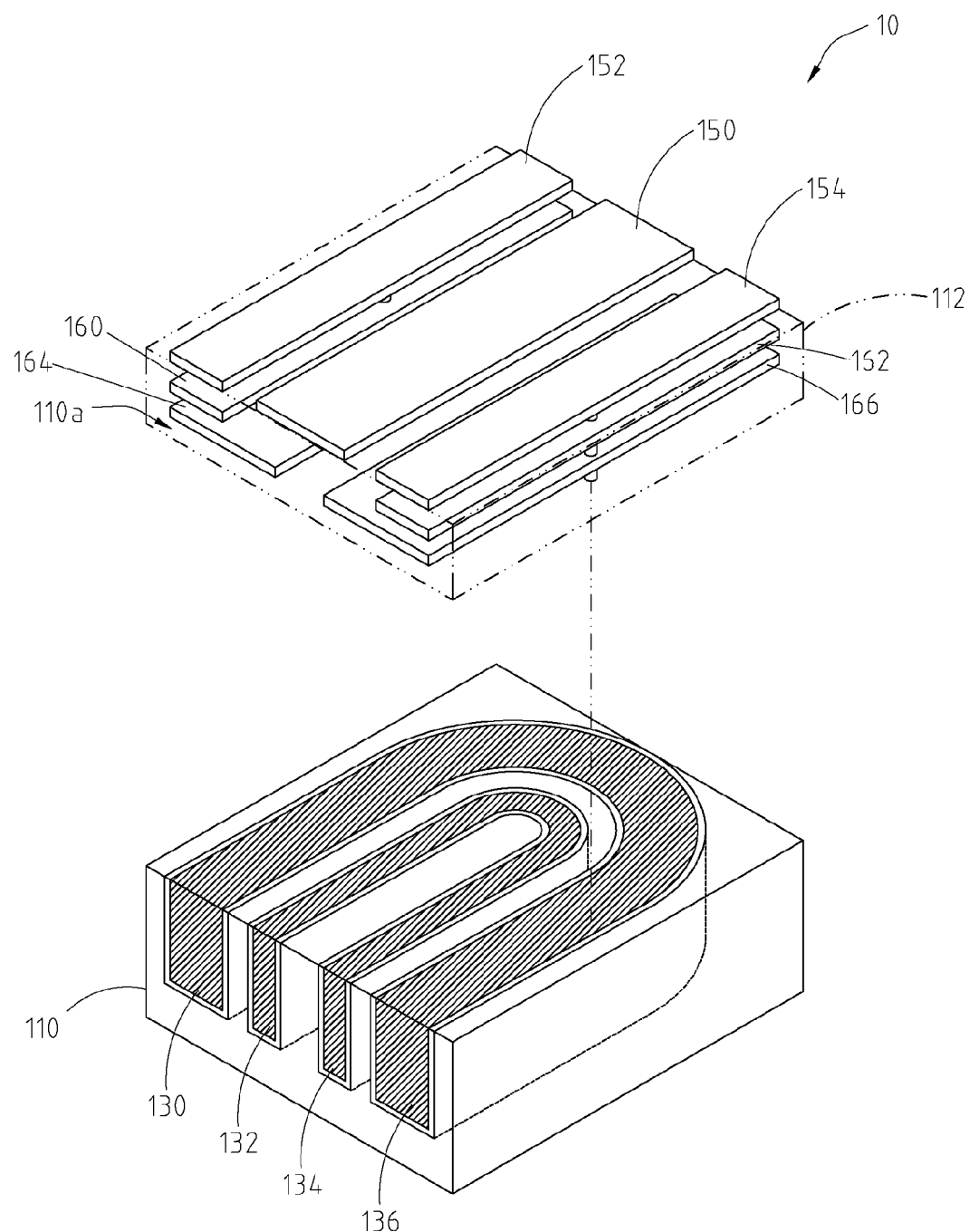
FIG. 11 is an exploded view of a signal-transmission-line structure according to an eighth embodiment of the present invention.
Figure 12:
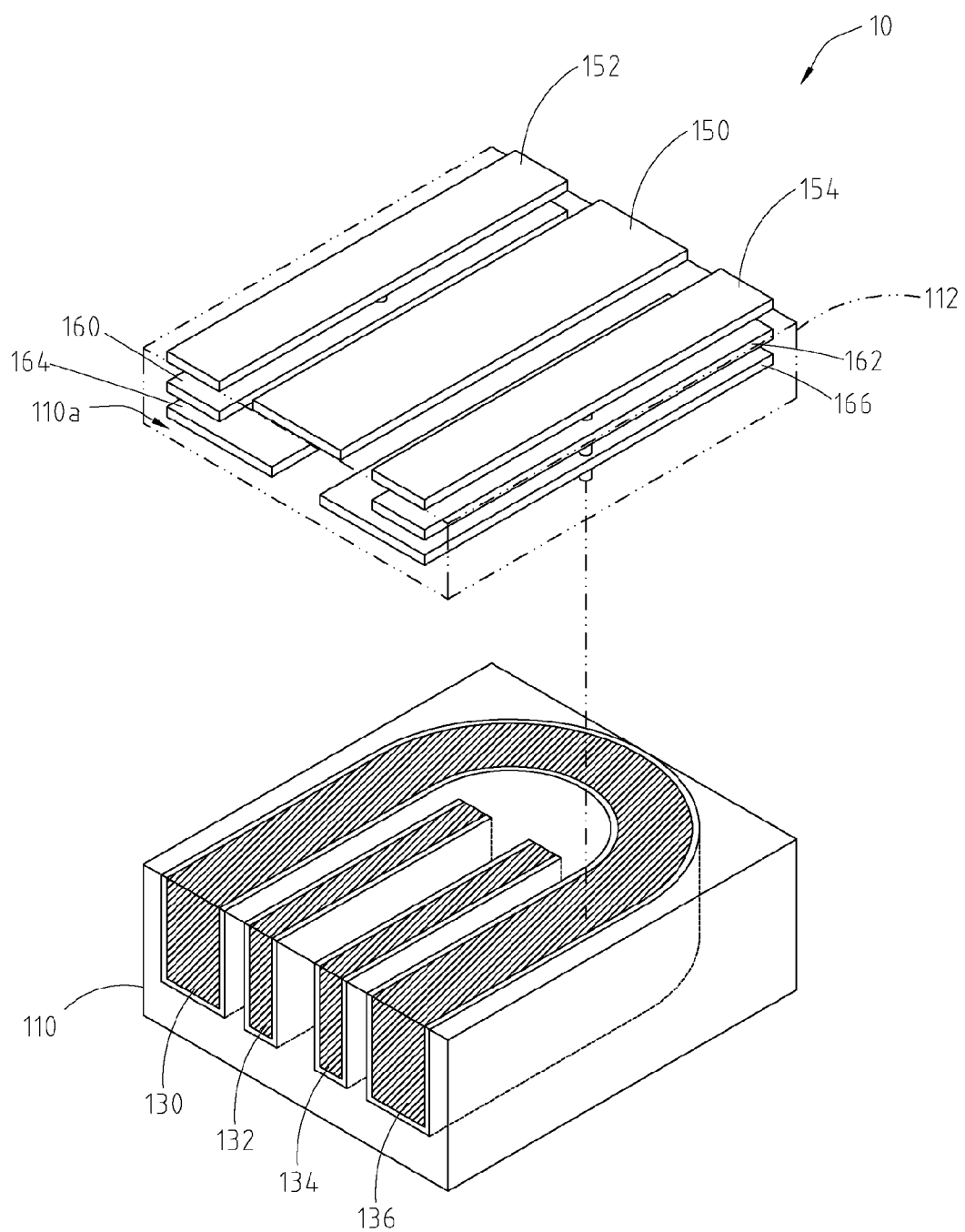
FIG. 12 is an exploded view of a signal-transmission-line structure according to a ninth embodiment of the present invention.
Figure 13:
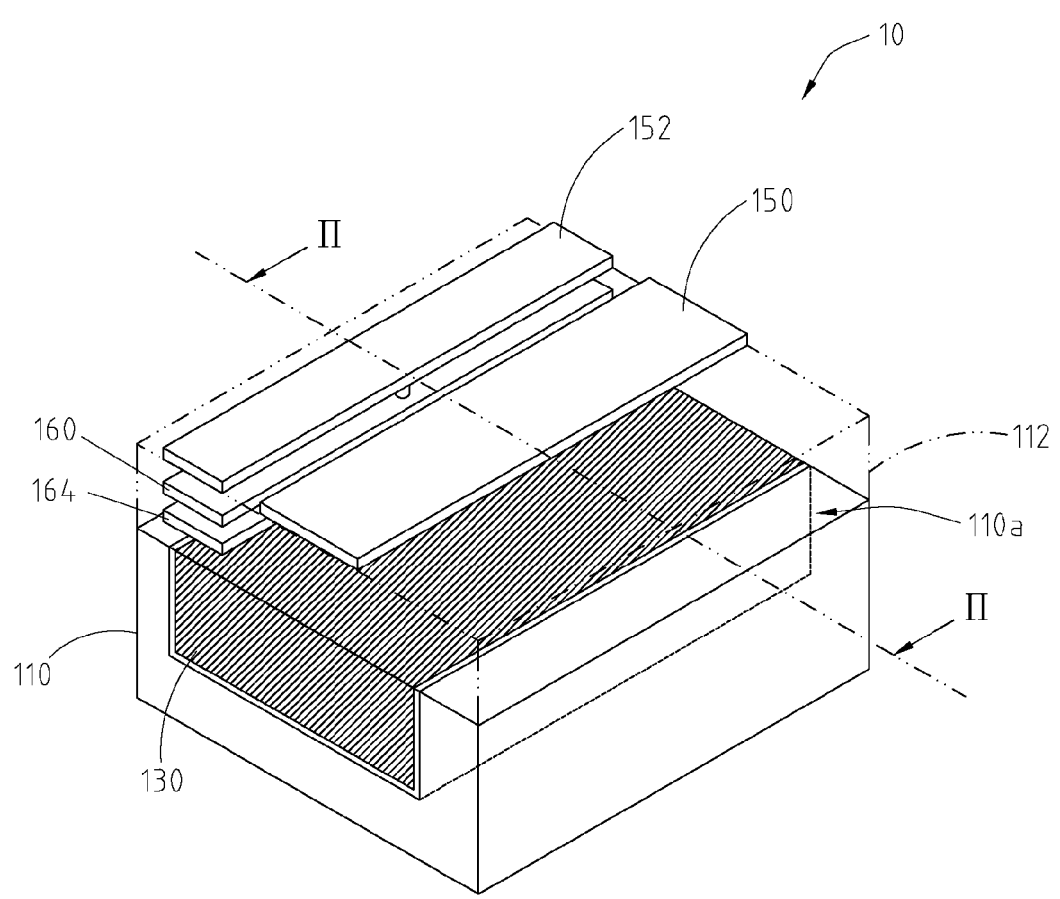
FIG. 13 is a schematic view of a signal-transmission-line structure according to a tenth embodiment of the present invention.
Figure 14:
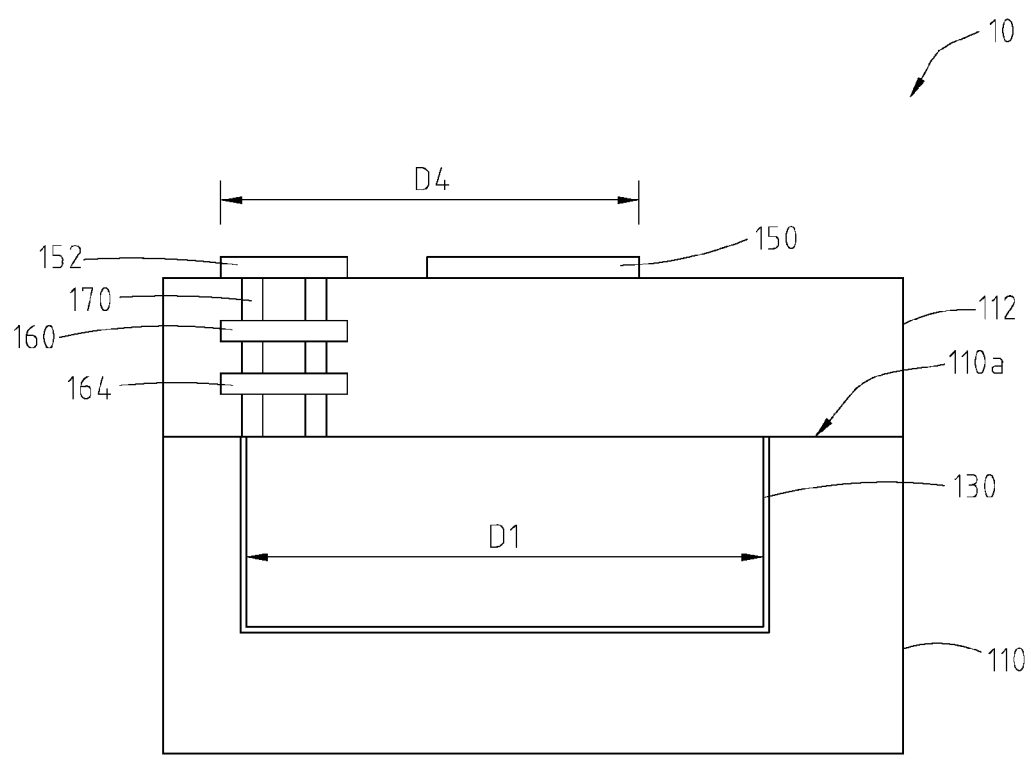
FIG. 14 is a sectional view of FIG. 13 along line II-II.

Here, the plurality of transmission lines 130, 132, 134 and 136 may all be configured linearly, as shown in FIG. 10. Moreover, the plurality of transmission lines 130 and, 132 may all be configured in a folded manner (as shown in FIG. 11), or one part of the transmission lines is configured linearly and the other part of the transmission lines is configured in a folded manner (as shown in FIG. 12), so as to reduce the configuration number of signal lines.

In some embodiments, referring to FIG. 8 to FIG. 14, the signal-transmission-line structure 10 may be provided with one or more through holes (referred to as first through holes 170 and 172).

The first through holes 170 and 172 penetrate the dielectric layer 112. One end of each first through hole 170 (or 172) is coupled to the transmission line 130 (or 136), and the other end of each first through hole 170 (or 172) is coupled to the first conductor wire 152 (or 154). In other words, the first through hole 170 connects the transmission line 130 and the first conductor wire 152, and the first through hole 172 connects the transmission line 136 and the first conductor wire 154.

In some embodiments, referring to FIG. 8 to FIG. 14, one or more circuit layers may be further disposed between the first conductor wires 150, 152 and 154 and the transmission lines 130, 132, 134 and 136. In other words, the signal-transmission-line structure 10 may further include other conductor wires (referred to as second conductor wires 160, 162, 164 and 166).

Each of the second conductor wires 160, 162, 164 and 166 is located on any circuit layer between the first conductor wires 150, 152 and 154 and the transmission lines 130, 132, 134 and 136. Here, any one of the second conductor wires 160, 162, 164 and 166 is disposed to be corresponding to one of the first conductor wires 150, 152 and 154.

The second conductor wires 160 and 164 are disposed correspondingly between the corresponding first conductor wire 152 and the corresponding transmission line 130, and any two thereof are separated by the dielectric layer 112. Here, the first through hole 170 coupled to the first conductor wire 152 and the transmission line 130 also penetrates and is coupled (electrically connected) to the second conductor wires 160 and 164, so that the transmission lines 130 are stacked to increase the depth, reduce the resistance, or enhance the shielding. The second conductor wires 160 and 164 may overlap the corresponding first conductor wire 152. Further, the second conductor wires 160 and 164 may also have substantially the same size with the corresponding first conductor wire 152.

Moreover, according to design requirements, the first conductor wire and the second conductor wire may have patterns the same as, different from or partially different from the pattern of the transmission line. For example, in FIG. 8, the (linear) pattern of the conductor wire is the same as the (linear) pattern of the transmission line; in FIG. 11, the (linear) pattern of the conductor wire is different from the (U-shaped) pattern of the transmission line; and in FIG. 12, the (linear) pattern of the conductor wire is partially the same as the pattern of the transmission line (the transmission lines 132 and 134 are linear), and is partially different from the pattern of the transmission line (the transmission line 136 is U-shaped). Furthermore, the pattern of the conductor wire may also match the pattern design of the corresponding transmission line, for example, in FIG. 12, a part of the first conductor wire or second conductor wire corresponding to the transmission line 136 is also of a U-shaped pattern.

The second conductor wires 162 and 166 are disposed correspondingly between the corresponding first conductor wire 154 and the corresponding transmission line 136, and any two thereof are separated by the dielectric layer 112. Here, the first through hole 172 coupled to the first conductor wire 154 and the transmission line 136 also penetrates and is coupled (electrically connected) to the second conductor wires 162 and 166. The second conductor wires 162 and 166 may overlap the corresponding first conductor wire 152. Further, the second conductor wires 160 and 164 may further have substantially the same size with the corresponding first conductor wire 152.

In some embodiments, the second conductor wires 160 and 162 are located in the same plane. The second conductor wires 160 and 162 may be formed by patterning the same metal layer.

In some embodiments, the second conductor wires 164 and 166 are located in the same plane. The second conductor wires 160 and 162 may be formed by patterning the same metal layer.

Here, the signal-transmission-line structure 10 forms grounded coplanar waveguide (GCPW) architecture.

In some embodiments, referring to FIG. 9, the signal-transmission-line structure 10 may be provided with other through holes (referred to as second through holes 174 and 176).

The second through holes 174 and 176 penetrate the dielectric layer 112. One end of each second through hole 174 (or 176) is coupled to the transmission line 132 (or 134), and the other end of each second through hole 174 (or 176) is coupled to the second conductor wire 164 (or 166). In other words, the second through hole 174 (or 176) connects the transmission line 132 (or 134) and the second conductor wire 164 (or 166).

Here, the signal-transmission-line structure 10 forms slotted-grounded coplanar waveguide (slotted GCPW) architecture. The direction of the slot may be parallel to the transmission line, or be perpendicular to the transmission line, or intersect with the transmission line by an angle of 45 degrees.

In some embodiments, the dielectric layer 112 may be one or more layers of dielectric material formed by one or more semiconductor processes.

In some embodiments, the signal-transmission-line structure 10 according to any embodiment of the present invention may have a high-frequency inductance effect, so as to sever as a high-frequency inductor required by any circuit.

In some embodiments, the signal-transmission-line structure 10 according to any embodiment of the present invention may be used for transmitting signals between two circuits.

Figure 15:
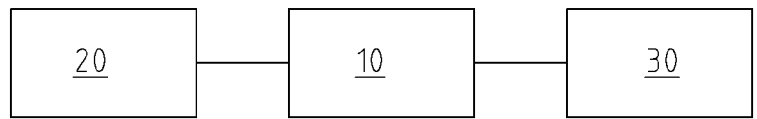
FIG. 15 is a schematic view of an embodiment of an electronic device using a signal-transmission-line structure.

Together referring to FIG. 15, an electronic device using a signal-transmission-line structure includes a front-stage circuit 20, the signal-transmission-line structure 10 according to any of the above embodiments, and a post-stage circuit 30.

One end of the signal-transmission-line structure 10 is coupled to the front-stage circuit 20, and the other end of the signal-transmission-line structure 10 is coupled to the post-stage circuit 30. In other words, the first conductor wires 150, 152 and 154 and the transmission lines 130, 132, 134 and 136 each have one end coupled to the front-stage circuit 20, and the first conductor wires 150, 152 and 154 and the transmission lines 130, 132, 134 and 136 each have the other end coupled to the post-stage circuit 30.

The signal-transmission-line structure 10 can provide a system switching function. In other words, the front-stage circuit 20 and the post-stage circuit 30 may have different characteristic impedances or different phases, and the signal-transmission-line structure 10 is used for switching or adjusting the characteristic impedance or phase.

Figure 16:
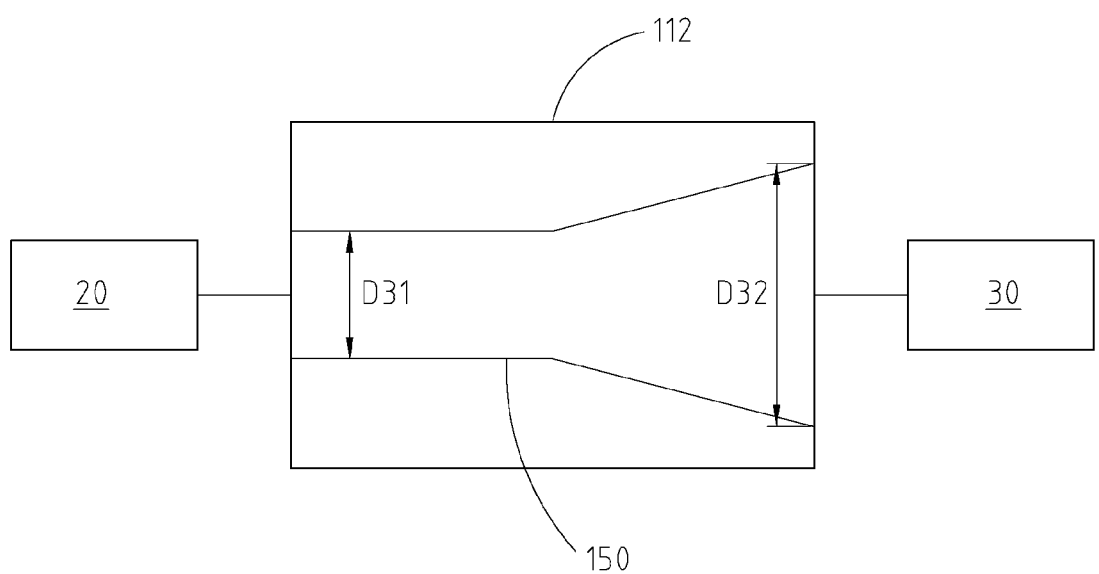
FIG. 16 is a schematic view of another embodiment of an electronic device using a signal-transmission-line structure.

For example, together referring to FIG. 16, the front-stage circuit 20 has a characteristic impedance of 75 ohm, and the post-stage circuit 30 has a characteristic impedance of 50 ohm. At this time, the width D31 (or a sectional area) of one end of the first conductor wire 150 coupled to the front-stage circuit 20 is less than the width D32 (or a sectional area) of the other end of the first conductor wire 150 coupled to post-stage circuit 30.

Accordingly, in the signal-transmission-line structure and the electronic device using the same according to the present invention, the TSV technology is used to form the transmission lines in the substrate, so as to provide a large distance required between a signal path and a ground path, thereby reducing a planar area used by the signal-transmission-line structure, and providing a preferable element feature. The signal-transmission-line structure and the electronic device using the same according to the present invention can provide low resistance, small parasitic capacitance, and large inductance, and can easily provide required characteristic impedance (such as 50 ohm or 75 ohm). Further, the signal-transmission-line structure and the electronic device using the same according to the present invention can further provide slow wave effects, so as to reduce required signal transmission length, thereby further reducing the area of a chip. The TSV processes may have a thinning progress for making the substrate thinner. This invention may have a thinning substrate process on the back side.

Figure 17:
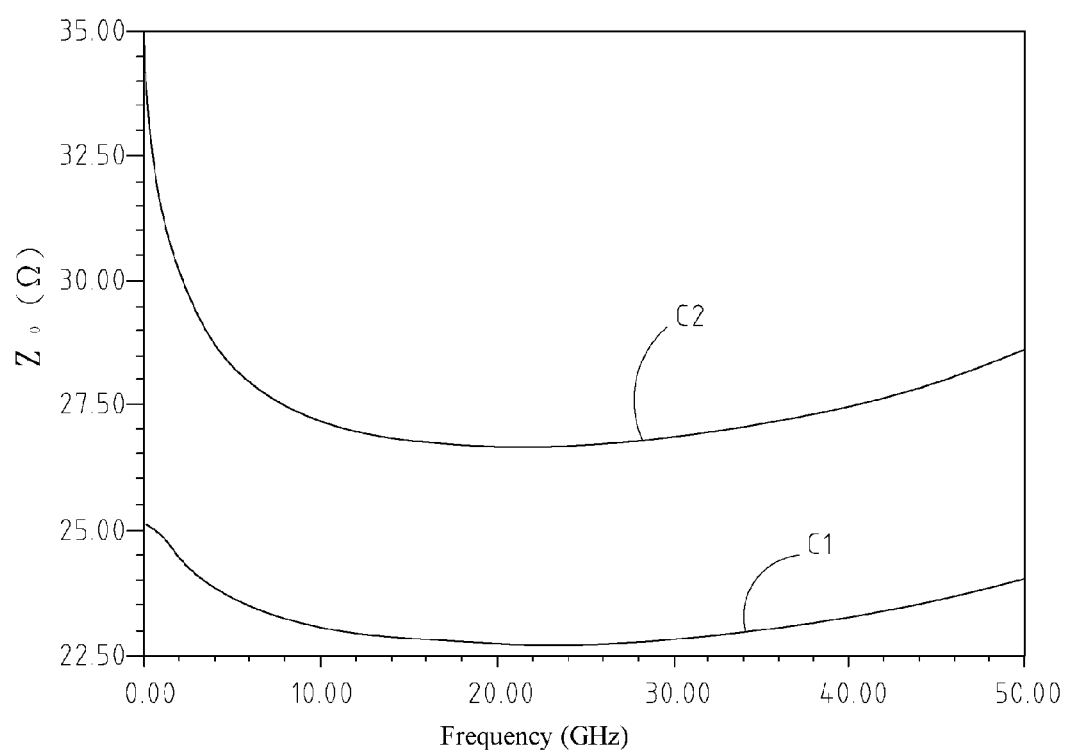
FIG. 17 is a graph showing changing relationship between frequency and characteristic impedance (Z0)
Figure 18:
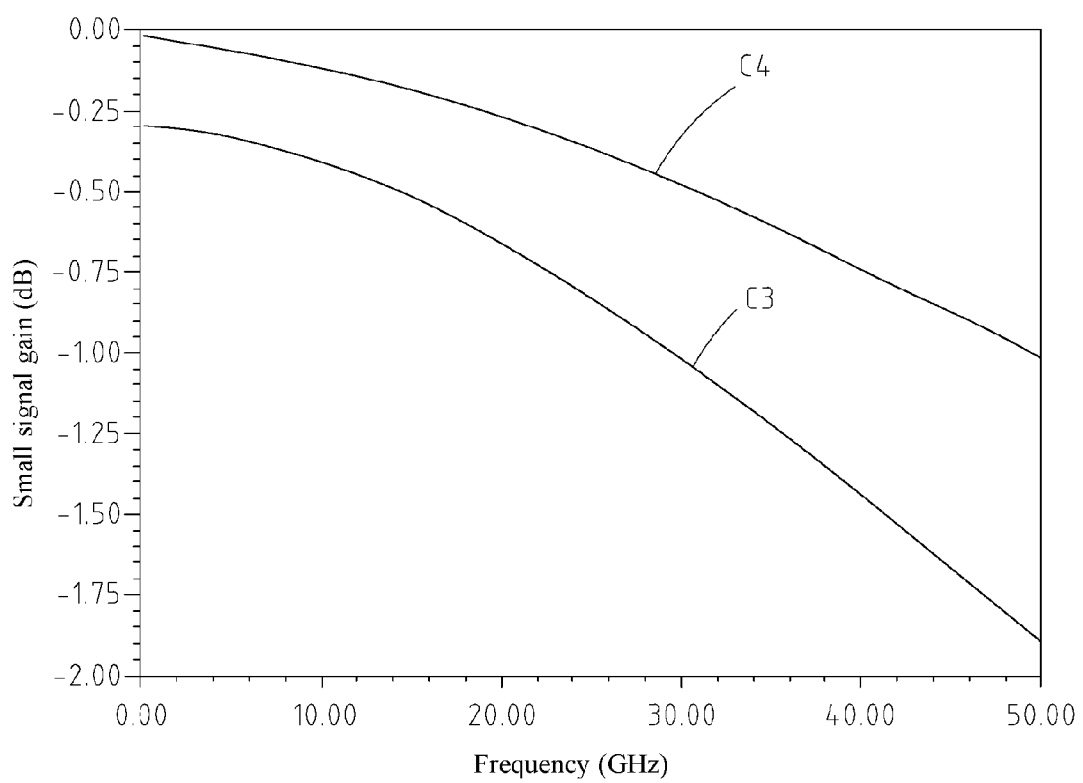
FIG. 18 is a graph showing changing relationship between frequency and small signal gain (S21).

For example, by using the signal-transmission-line structure 10 that is shown in FIG. 6 as an example, here, the width D3 of the first conductor wire 150 is designed as 8 μm, the width D1 of the transmission line 130 is three times of the width D3 of the first conductor wire 150, the thickness H3 of the first conductor wire 150 is 3.4 μm, and an absolute distance between the lower surface of the first conductor wire 150 and the upper surface of the transmission line 130 is 1.5 μm. In a conventional signal-transmission-line structure, two correspondingly metal layers are formed respectively in two surfaces of a dielectric layer. Referring to FIG. 17, in a characteristic impedance (Z0) test, compared with the conventional signal-transmission-line structure (for example, curve C1 in the graph), the signal-transmission-line structure 10 (for example, curve C2 in the graph) according to an embodiment of the present invention is improved by about 70%. Referring to FIG. 18, in a small signal gain (S21) test, compared with the conventional signal-transmission-line structure (for example, curve C3 in the graph), the signal-transmission-line structure 10 (for example, curve C4 in the graph) according to an embodiment of the present invention is improved by more than 0.25 dB, and provides loss-free analog signal transmission.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An electronic device using a signal-transmission-line structure, comprising:

a signal-transmission-line structure, comprising:
- a substrate, having a first surface and a second surface opposite to each other;
- a through-silicon via (TSV) trench, formed in the first surface and extending along the first surface, wherein the bottom surface of the TSV trench is located between the first surface and the second surface;
- a conductive substance, wherein the TSV trench is filled with the conductive substance to form a transmission line;
- at least a first conductor wire, located above the transmission line; and
- a dielectric layer, located on the first surface and separating the at least a first conductor wire from the transmission line;
- a front-stage circuit, coupled to one end of the transmission line and one end of the at least a first conductor wire; and
- a post-stage circuit, coupled to the other end of the transmission line and the other end of the at least a first conductor wire,
- wherein, the front-stage circuit and the post-stage circuit have different characteristic impedances or different phases, and the signal-transmission-line structure is used for adjusting the characteristic impedance or the phase.

2. The electronic device using a signal-transmission-line structure according to claim 1, wherein the width of one end of the at least a first conductor wire is different from the width of the other end of the at least a first conductor wire.

3. The electronic device using a signal-transmission-line structure according to claim 1, wherein the number of the at least a first conductor wire is greater than one, and the signal-transmission-line structure further comprises:
- at least a first through hole, penetrating the dielectric layer, one end of each first through hole being coupled to the transmission line, and the other end of each first through hole being coupled to one of the at least a first conductor wire.

4. The electronic device using a signal-transmission-line structure according to claim 3, further comprising:
- at least a second conductor wire, located between the transmission line and the first conductor wire, wherein the at least a first through hole penetrates and is coupled to the at least a second conductor wire.

5. The electronic device using a signal-transmission-line structure according to claim 1, wherein the arranged width of the TSV trench is greater than the arranged width of the at least a first conductor wire.

6. The electronic device using a signal-transmission-line structure according to claim 1, wherein a pattern of the at least a first conductor wire is at least partially the same as a pattern of the transmission line.

7. The electronic device using a signal-transmission-line structure according to claim 1, wherein the depth of the TSV trench is greater than one half of the thickness of the substrate.

8. The electronic device using a signal-transmission-line structure according to claim 1, wherein the depth of the TSV trench is greater than 5 μm.

9. The electronic device using a signal-transmission-line structure according to claim 1, further comprising:
- an insulating layer, located between the substrate and the transmission line, for separating the transmission line from the substrate.

10. A signal-transmission-line structure, comprising:
- a substrate, having a first surface and a second surface opposite to each other;
- a through-silicon via (TSV) trench, formed in the first surface and extending along the first surface, wherein the bottom surface of the TSV trench is located between the first surface and the second surface;
- a conductive substance, wherein the TSV trench is filled with the conductive substance to form a transmission line;
- at least a first conductor wire, located above the transmission line; and
- a dielectric layer, located on the first surface and separating the at least a first conductor wire from the transmission line.

* * * * *